(12) United States Patent
Oswald et al.

(10) Patent No.: US 7,683,719 B2
(45) Date of Patent: Mar. 23, 2010

(54) INTERNAL FREQUENCY COMPENSATION CIRCUIT FOR INTEGRATED CIRCUIT CONTROLLERS

(75) Inventors: Richard Oswald, San Jose, CA (US); Tamotsu Yamamoto, Cupertino, CA (US); Takashi Ryu, Kyoto (JP)

(73) Assignee: Panasonic Corporation, Osaka (JP)

( * ) Notice: Subject to any disclaimer, the term of this patent is extended or adjusted under 35 U.S.C. 154(b) by 140 days.

(21) Appl. No.: 11/896,973

(22) Filed: Sep. 7, 2007

(65) Prior Publication Data

US 2009/0066421 A1    Mar. 12, 2009

(51) Int. Cl.
    *H03F 1/14*    (2006.01)
(52) U.S. Cl. .................................................. 330/292
(58) Field of Classification Search ......... 330/291–294; 327/341
    See application file for complete search history.

(56) References Cited

U.S. PATENT DOCUMENTS

| | | | |
|---|---|---|---|
| 4,378,530 A | 3/1983 | Garde |
| 4,727,308 A | 2/1988 | Huljak et al. |
| 4,943,902 A | 7/1990 | Severinsky |
| 4,959,606 A | 9/1990 | Forge |
| 5,305,192 A | 4/1994 | Bonte et al. |
| 5,420,530 A | 5/1995 | Mita |
| 5,420,532 A | 5/1995 | Teggatz et al. |
| 5,479,090 A | 12/1995 | Schultz |
| 5,600,234 A | 2/1997 | Hastings et al. |
| 5,903,447 A | 5/1999 | Takahashi et al. |
| 5,905,407 A | 5/1999 | Midya |
| 5,929,620 A | 7/1999 | Dobkin et al. |
| 5,949,229 A | 9/1999 | Choi et al. |
| 5,982,160 A | 11/1999 | Walters et al. |
| 5,991,182 A | 11/1999 | Novac et al. |
| 6,034,517 A | 3/2000 | Schenkel |
| 6,046,516 A | 4/2000 | Maier et al. |
| 6,066,943 A | 5/2000 | Hastings et al. |
| 6,147,478 A | 11/2000 | Skelton et al. |
| 6,166,528 A | 12/2000 | Rossetti et al. |
| 6,222,356 B1 | 4/2001 | Taghizadeh-Kaschani |
| 6,268,756 B1 | 7/2001 | Nayebi et al. |
| 6,304,066 B1 | 10/2001 | Wilcox et al. |
| 6,307,356 B1 | 10/2001 | Dwelley |
| 6,313,610 B1 | 11/2001 | Korsunsky |
| 6,366,070 B1 | 4/2002 | Cooke et al. |
| 6,396,250 B1 | 5/2002 | Bridge |
| 6,404,261 B1 | 6/2002 | Grover et al. |
| 6,411,163 B1 * | 6/2002 | Enriquez ..................... 330/257 |
| 6,476,589 B2 | 11/2002 | Umminger et al. |
| 6,498,466 B1 | 12/2002 | Edwards |
| 6,509,721 B1 | 1/2003 | Liebler |
| 6,522,178 B2 | 2/2003 | Dubhashi et al. |
| 6,541,947 B1 | 4/2003 | Dittmer et al. |
| 6,563,725 B2 | 5/2003 | Carsten |

(Continued)

*Primary Examiner*—Robert Pascal
*Assistant Examiner*—Khiem D Nguyen
(74) *Attorney, Agent, or Firm*—McDermott Will & Emery LLP

(57) ABSTRACT

A frequency compensation circuit internal to an integrated circuit which comprises a transconductance amplifier having a first input configured to receive a reference voltage, a second input configured to receive an input voltage and an input current, a first output configured to output a first output current and a second output configured to output a second output current; and a compensation circuit connected to said second output of said transconductance amplifier, wherein said first output is connected to said second input.

17 Claims, 4 Drawing Sheets

U.S. PATENT DOCUMENTS

| | | |
|---|---|---|
| 6,611,131 B2 | 8/2003 | Edwards |
| 6,724,174 B1 | 4/2004 | Esteves et al. |
| 6,744,241 B2 | 6/2004 | Feldtkeller |
| 6,828,766 B2 | 12/2004 | Corva et al. |
| 6,873,140 B2 | 3/2005 | Saggini et al. |
| 6,894,471 B2 | 5/2005 | Corva et al. |
| 6,979,985 B2 | 12/2005 | Yoshida et al. |
| 7,030,596 B1 | 4/2006 | Salemo et al. |
| 7,091,711 B2 | 8/2006 | Yoshida et al. |
| 7,109,693 B2 | 9/2006 | Yoshida et al. |
| 7,180,370 B2 * | 2/2007 | Forbes et al. ............... 330/253 |
| 2003/0025484 A1 | 2/2003 | Edwards |

* cited by examiner

CMOS OUTPUTS

BIPOLAR OUTPUTS

INTERNAL FREQUENCY COMPENSATION CIRCUIT FOR INTEGRATED CIRCUIT CONTROLLERS

BACKGROUND OF THE INVENTION

1. Field of the Invention

This invention relates to a frequency compensation configuration for integrated circuit (IC) controllers using closed loop feedback. In particular, this invention relates to a circuit for summing the difference between two voltages with another variable, such as, for example, a current.

2. Background of the Related Art

In electronic circuit implementations of IC control systems, it is often required to sum a difference between a variable voltage and a reference voltage with another variable such as a current. It is also required to further process the summed result with an integrator that may, in addition to the pole near zero frequency, also have a real zero at a finite frequency, and to output this result as a voltage to be used in other functions.

This function would ordinarily be accomplished with a circuit implementation utilizing an operational amplifier as shown in FIG. 1. Referring to FIG. 1, the circuit includes an amplifier 20 having a gain of A, a voltage source 1, a current source 2 and a reference voltage 4. The voltage source 1 is coupled to a negative input of the amplifier 20 through a resistance 3 and the current source 2 is also coupled to the negative input of the amplifier 20. The reference voltage 4 is coupled to a positive input of the amplifier 20. The output of the amplifier 20 is coupled to the negative input through a feedback connection comprising a resistance 5 and a capacitance 6.

Assuming the input impedance of the amplifier 20 is large enough and initial conditions are ignored, the transfer function in the frequency domain of the circuit shown in FIG. 1 is:

$$\frac{-V_{OUT}}{\left(\frac{V_1 - V_{REF} + \frac{V_{OUT}}{A}}{R_S} - I_2\right)} = \frac{SR_F C_F + 1}{SC_F \left(1 + \frac{1}{A}\right)}, \quad (1)$$

where A is the gain of the amplifier 20. If A>>1, then the term 1/A becomes negligible. It is noted that this expression can be extended with additional voltage variable and/or current variable inputs (in addition to $V_1$ and $I_2$).

However, there are difficulties when implementing this circuit in an integrated circuit. For example, the required value $C_F$ of the capacitance 6 may be difficult to realize because of the physical size of the capacitance in the integrated circuit. It is also difficult to initialize a desired value of voltage on the capacitance 6 because neither of its terminals is grounded.

Therefore, there is a need for a circuit capable of summing the difference between two voltages with another variable such as a current that overcomes aforementioned difficulties associated with prior art circuit designs.

SUMMARY OF THE INVENTION

Accordingly, the present invention relates to a frequency compensation circuit internal to an integrated circuit which overcomes the deficiencies of the prior art designs. In an exemplary embodiment, the internal frequency compensation circuit of the present invention comprises a transconductance amplifier having a first input configured to receive a reference voltage, a second input configured to receive an input voltage and an input current, a first output configured to output a first output current, and a second output configured to output a second output current; and a compensation network connected between the second output of the transconductance amplifier and a reference potential, wherein the first output is connected to the second input.

The transconductance amplifier of the internal frequency compensator of the present invention is configured to provide an output current proportional to a sum of the input current and a current proportional to a difference between the reference voltage and the input voltage. Further, the compensation network of the present invention comprises a capacitor having one terminal connected to a reference potential such as ground.

Among other advantages as noted below, the internal frequency compensation circuit of the present invention provides means to modify the capacitance value $C_F$ in the compensation circuit without changing the transfer function. In addition the internal frequency compensation circuit of the present invention provides easier control of the initial condition voltage of the capacitor. The circuit of the present invention can also easily provide multiple independent current outputs all of which are proportional to the same inputs without additional amplifiers or amplifier input stages.

The invention itself, together with further objects and advantages, can be better understood by reference to the following detailed description and the accompanying drawings.

DETAILED DESCRIPTION OF THE INVENTION

Figure 1:
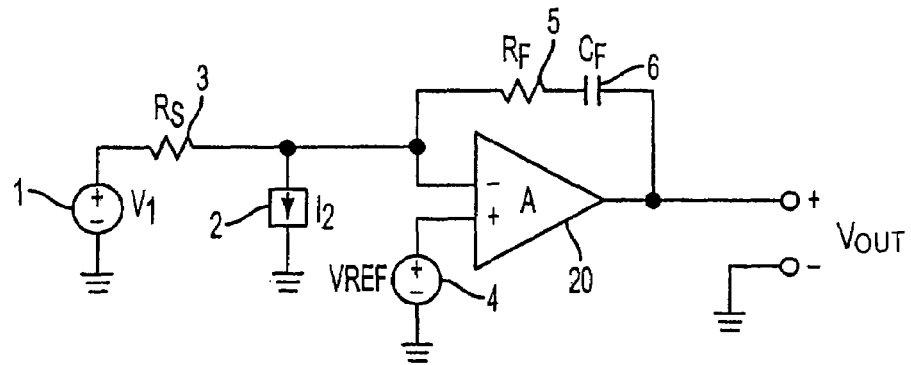
FIG. 1 is a block diagram of a prior art internal frequency compensator.
Figure 2:
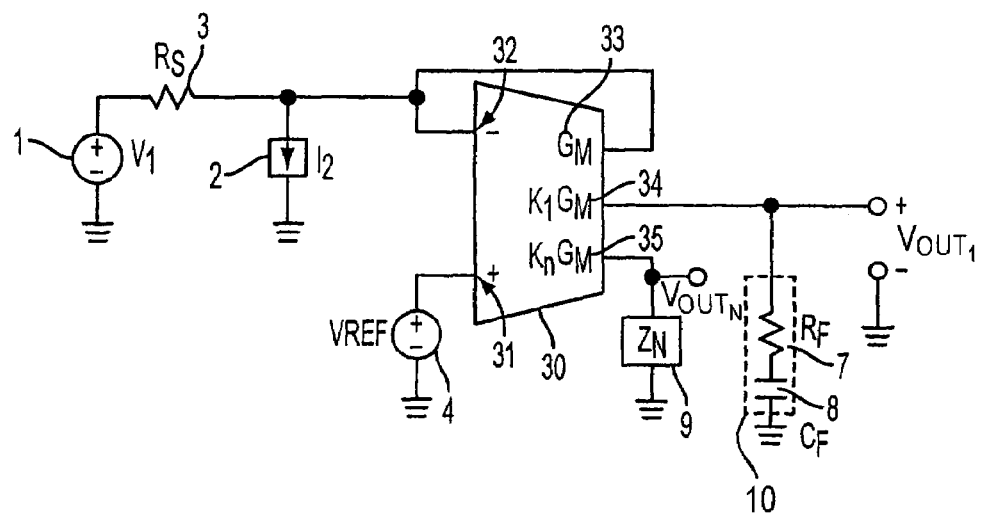
FIG. 2 is an exemplary block diagram of a frequency compensation circuit in accordance with the present invention.

FIG. 2 shows an exemplary embodiment of a frequency compensation circuit 100 in accordance with the present invention. Referring to FIG. 2, the frequency compensation circuit 100 comprises a transconductance amplifier 30 which is a voltage controlled current source, a voltage source 1, a current source 2 and a reference voltage 4. The voltage source 1 is coupled to a negative input 32 of the transconductance amplifier 30 through a resistance 3 and the current source 2 is also coupled to the negative input 32 of the transconductance amplifier 30. The reference voltage 4 is coupled to a positive input 31 of the transconductance amplifier 30. The primary output of the transconductance amplifier 30 is coupled to the negative input 32 through a feedback connection. The first output of the transconductance amplifier 30 is coupled to a first compensation network 10 comprising a resistance 7 and a capacitance 8. A second output of the transconductance amplifier 30 can be coupled to additional compensation impedance 9 or other circuits.

The transconductance amplifier 30 in the given embodiment has a differential voltage input comprising a positive input 31 and a negative input 32, and a first current source output 33 with a gain $G_m$. Further, the transconductance amplifier 30 in the given embodiment has one or more secondary independent current outputs 34, 35 with matched but magnitude scaled gains $k_1 \times G_m, \ldots, k_n \times G_m$, where $k_n$ (n=1, 2, ...) are predetermined scaling factors that may be less than, equal to or more than 1.

The primary current output 33 is connected to the negative input 32 to provide a feedback function. Thus, the negative input 32 is driven to the same potential as the positive input by the large value of $G_m$ and the feedback connection. The negative input 32 is also coupled to the voltage source 1 via the resistance 3 and to the current source 2, while the positive input 31 is coupled to the reference voltage 4.

The first current output 34 is coupled to a first compensation network 10 comprising a resistance 7 and a capacitance 8. It is noted that one of the terminals of the capacitance 8 is connected to ground or other suitable reference potential. Alternatively, the compensation network comprising capacitance 8 may be indirectly connected to ground or other reference potential via the series resistance 7. Since the capacitance 8 is connected to ground or the reference potential, it is easy to control an initial voltage of the capacitance 8 (for example, to initialize or reset the circuit). The transconductance amplifier 30 may have additional independent outputs 35 connected to separate impedances 9 having an impedance value of $Z_n$ to provide different transfer functions or to drive other circuits.

Assuming the input impedance of the transconductance amplifier 30 is large enough and initial conditions are ignored, the voltage transfer function for the output of this circuit taken at 34 is:

$$\frac{-V_{OUT}}{\left(\frac{V_1 - V_{REF} + \frac{V_{OUT}}{k_1 G_m \left(R_F + \frac{1}{SC_F}\right)}}{R_S}\right) - I_2} = \frac{SR_F C_F + 1}{S \frac{C_F}{k_1}} \quad (2)$$

Similarly, assuming $k_1 R_F G_m \gg 1$, the transfer function for the secondary current output 35 is:

$$\frac{-V_{OUT}}{\left(\frac{V_1 - V_{REF}}{R_S} - I_2\right)} = k_n Z_n \quad (n = 1, 2, \ldots) \quad (3)$$

It is noted that with the advantages of multiple independent outputs, the capacitor size $C_F$ (or $Z_n$) can be easily scaled with the factor $k_1$ (or $k_n$). In addition, the secondary current outputs which have scaled but proportional outputs related to the same inputs may have different filter functions, for example proportional and integral outputs, different filter types or bandwidths, comparator or window functions and etc.

The transconductance amplifier 30 in the given embodiment has an input circuit block 40 and an output circuit block 50.

Figure 3:
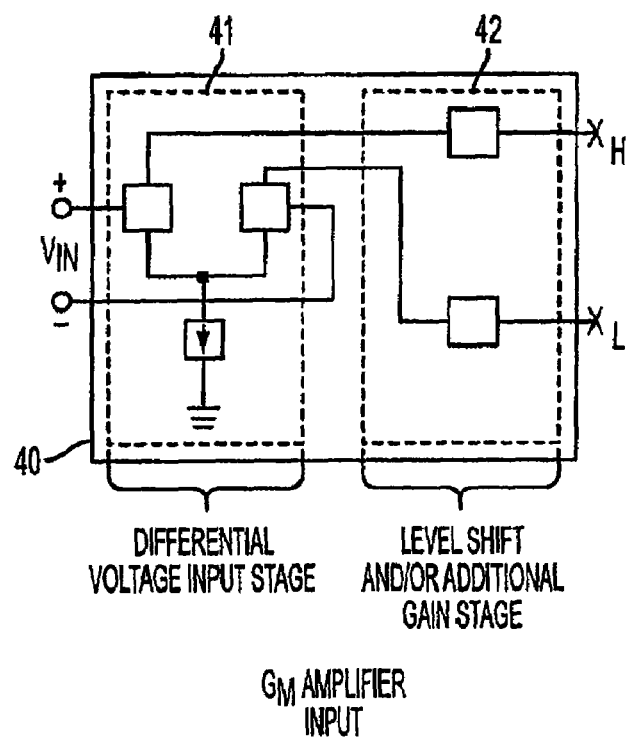
FIG. 3 is an exemplary circuit diagram of an input circuit implementation of a frequency compensation circuit in accordance with the present invention.
Figure 4A:
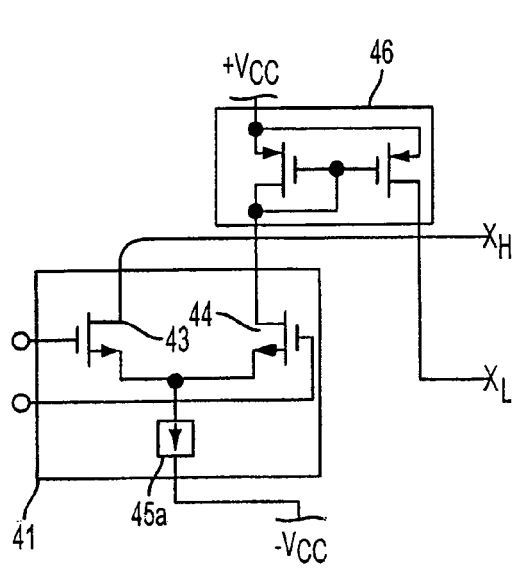
FIG. 4 is an exemplary block diagram of alternative implementations of an input circuit block for use in a frequency compensation circuit in accordance with the present invention.
Figure 4B:
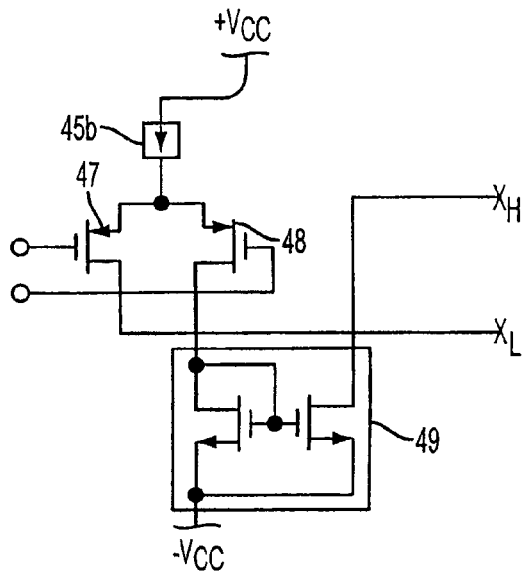
Figure 4C:
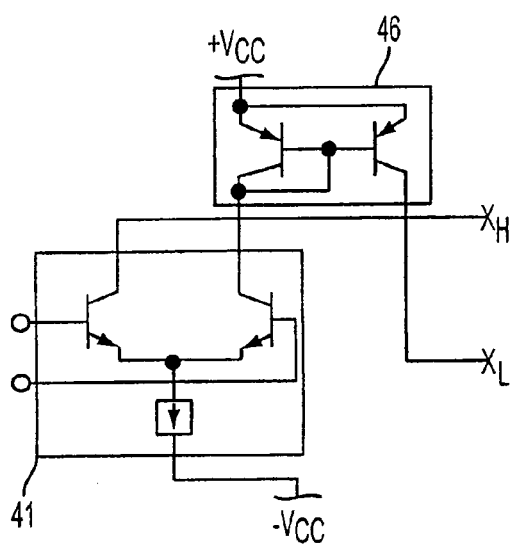
Figure 4D:
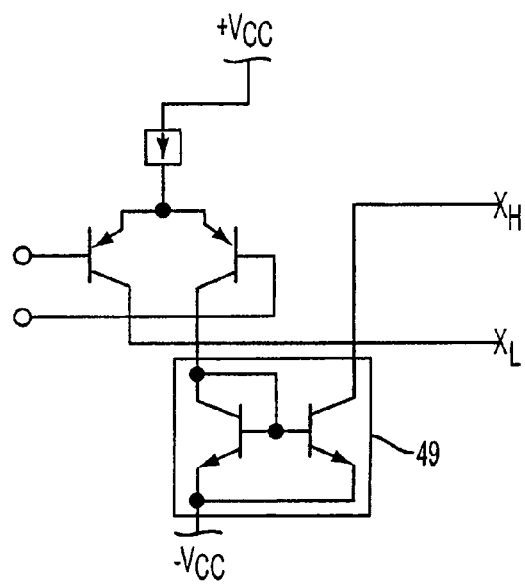

Examples of the configuration of the input circuit block 40 are shown in FIGS. 3 and 4. The input circuit block 40 further comprises a differential voltage input stage 41 and a level shift and/or additional current gain stage 42. The input circuit block may output a high side signal $X_H$ or a low side signal $X_L$. Examples of the detailed configuration of the input circuit block 40 are shown in FIGS. 4a-4d. As shown for example in FIG. 4a, the differential voltage input stage 41 may comprise two NMOS transistors 43 and 44 and a bias current sink 45a. A level shift stage 42 may comprise a PMOS current mirror 46. In FIG. 4b, the differential voltage input stage 41 may comprise two PMOS transistors 47 and 48 and a bias current source 45b. The level shift stage 42 may comprise a NMOS mirror 49. In FIGS. 4c and 4d, the MOS transistors are replaced with bipolar transistors.

The input circuit comprises the differential voltage input stage with complementary current outputs $X_H$ and $X_L$, where $X_H$ is a sink current and $X_L$ is a source current. $|X_H|+|X_L|=|$bias current$|$ or if additional gain is needed, $|X_H|+|X_L|=k \times |$bias current$|$, where k is a factor greater than 1. The current mirror is needed to provide the correct polarity currents to drive the output stages. In function, this circuit converts a differential input voltage into complementary currents for driving on output stage.

Figure 5A:
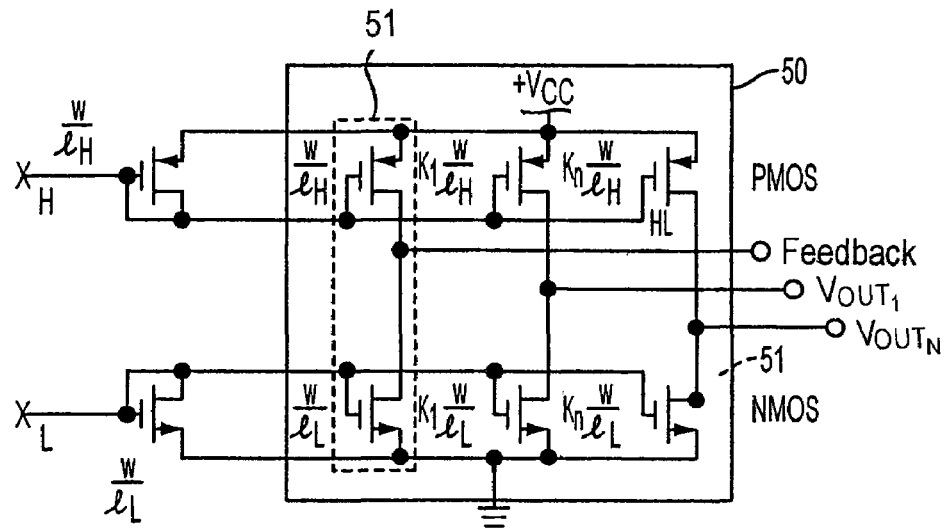
FIG. 5 is an exemplary circuit diagram of some alternative implementations of an output circuit block for use in a frequency compensation circuit in accordance with the present invention.
Figure 5B:
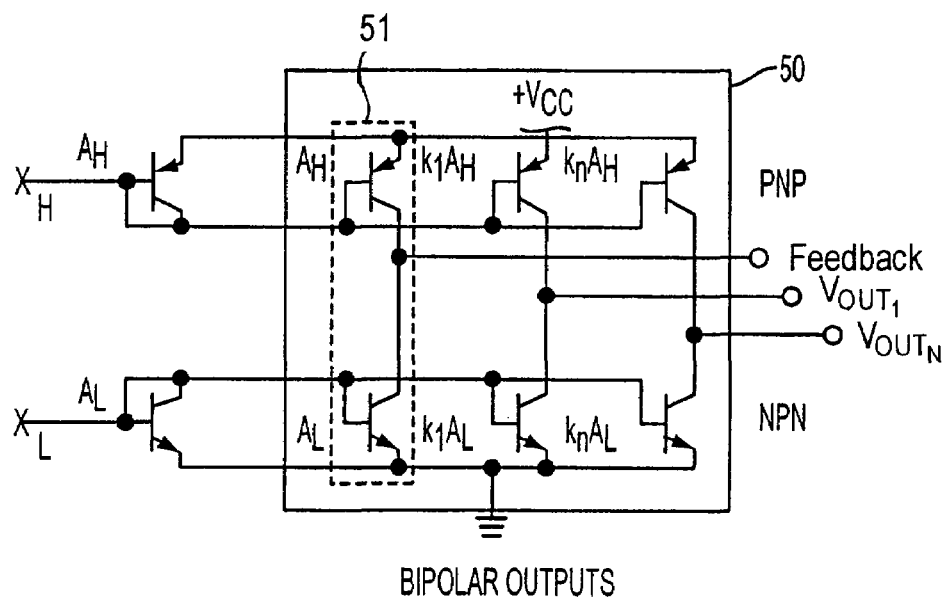

Examples of the configuration of the output circuit block 50 are shown in FIGS. 5a and 5b. In the given embodiment, CMOS transistors (FIG. 5a) or bipolar transistors (FIG. 5b) may be employed. The output circuit block 50 may comprise n additional stages (n=1, 2, ...), each having a complementary pair of transistors (NMOS and PMOS or NPN and PNP).

As shown for example in FIG. 5a, in each stage, the sources of the PMOS transistors are coupled to Vcc and the sources of the NMOS transistors are coupled to ground. The complementary signals from the input circuit block 40, $X_H$ and $X_L$ shown in FIGS. 5a and 5b, are connected to the gate (or base) terminal of the PMOS (PNP) transistors and the NMOS (NPN) transistors, respectively, in each stage. Here, w/l indicate the relative dimensions of the MOS transistors and A indicate the relative emitter areas (sizes) of the bipolar transistors. Subscripts H and L indicate high side and low side. Complementary driving signals from the input stage are connected to the output stage at X. The output from the first stage 51, which is taken at the drain terminals of the transistors in the first output stage, may constitute the current output used for feedback to the input and the outputs from $n^{th}$ stages (n=2, 3, ...) may constitute the secondary current outputs, where n=1 is for the primary compensator and n=2, 3, . . . are secondary current outputs for other uses.

It is noted that only one input circuit block 40 is required even for multiple outputs. The input referred offsets for ratio scaled and matched (proportional to w/l or A) outputs scale by the same factors ($k_n$). Also, $G_m$ has to be only sufficiently large for equation (3) to be valid without any requirement for a specific value or temperature dependence. In this point, the present invention differs from classic "$G_m$-C" filters, and large $G_m$ is usually as easy to achieve as large A.

In classical "$G_m$-C" filters, the response is a function of the actual value of the parameter $G_m$, so $G_m$ must be a value independent of process variation and temperature and changing only with the value of a prescribed additional (control) signal (e.g. for a tuning frequency control). In general, the $G_m$ of a differential voltage input stage to output current depends on process parameters, transistor sizes, die temperature and etc, as well as the bias current. Here, the circuit output is set by $R_s$ and $Z_n$ and not by actual $G_m$'s but only $G_m$ ratios (factor k's).

One of the advantages associated with the present invention is the use of the transconductance amplifier 30. With the scaling factors $k_n$, the capacitance value $C_F$ in the compensation network 10 can be easily modified. In addition, since the capacitor 8 in the compensation network 10 is connected to ground (or other reference potential), the circuit of the present invention allows easy initialization or reset of the voltage of the capacitor 8.

Another advantage associated with the present invention is that it can also provide multiple outputs all accurately proportional to each other and having the same input referenced voltage offset and variation with bias current.

Although certain specific embodiments of the present invention have been disclosed, it is noted that the present invention may be embodied in other forms without departing from the spirit or essential characteristics thereof. Thus, the present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A frequency compensation circuit internal to an integrated circuit, comprising:
    a transconductance amplifier having a first input configured to receive a reference voltage, a second input configured to receive an input voltage and an input current, a first output configured to output a first output current and a second output configured to output a second output current; and
    a compensation network connected to said second output of said transconductance amplifier,
    wherein said first output is directly connected to said second input.

2. The frequency compensation circuit of claim 1, wherein said transconductance amplifier is configured to output an output current proportional to a sum of an input current with a current proportional to a difference between said reference voltage and said input voltage.

3. The frequency compensation circuit of claim 1, wherein said first output of said transconductance amplifier has a first gain $Gm_1$ and said second output of said transconductance amplifier has a second gain $Gm_2$, and $Gm_2 = k \times Gm_1$, where k is a predetermined scaling factor.

4. The frequency compensation circuit of claim 1, wherein said compensation network comprises a capacitor having one end connected to a reference potential or ground.

5. The frequency compensation circuit of claim 1, wherein said transconductance amplifier comprises:
    an input section configured to output a high side signal and a low side signal; and
    an output section configured to receive said high side signal and said low side signal from said input section and to output said first output current and said second output current.

6. The frequency compensation circuit of claim 5, wherein said input section of said transconductance amplifier comprises a differential voltage input stage and a level shift and additional gain stage, and said level shift and additional gain stage is configured to output said high side signal and said low side signal.

7. The frequency compensation circuit of claim 5, wherein said output section comprises two pairs of complementary transistors, each of said pairs of complementary transistors comprising a p-type transistor and a n-type transistor, and said high side signal is directed to control terminals of p-type transistors and said low side signal is directed to control terminals of n-type transistors.

8. The frequency compensation circuit of claim 7, wherein each of said two pairs of complementary transistors comprises a NMOS and PMOS transistor.

9. The frequency compensation circuit of claim 7, wherein each of said two pairs of complementary transistors comprises a NPN and PNP transistor.

10. A frequency compensation circuit internal to an integrated circuit, comprising:
    a transconductance amplifier having a first input configured to receive a reference voltage, a second input configured to receive an input voltage and an input current, a first output configured to output a first output current and directly connected to said second input, and a plurality of secondary outputs configured to output secondary output currents wherein a number of said secondary outputs is N (N=1, 2, 3, ... ); and
    a plurality of compensator impedances, each of said compensator impedances connected to each of said secondary outputs,
    wherein a first output of said plurality of secondary outputs has a first gain $G_m$, and a $M^{th}$ output (M=2, 3, ... N) has a $M^{th}$ gain $k_M \times Gm$.

11. The frequency compensation circuit of claim 10, wherein said transconductance simplifier is configured to output an output current proportional to a sum of said input current with a current proportional to a difference between said reference voltage and said input voltage.

12. The frequency compensation circuit of claim 10, wherein at least one of said plurality of compensator impedances comprises a capacitor connected to ground.

13. The frequency compensation circuit of claim 10, wherein said transconductance amplifier comprises:
    an input section configured to output a high side signal and a low side signal; and
    an output section configured to receive said high side signal and said low side signal from said input section and to output said first output current and said secondary output currents.

14. The frequency compensation circuit of claim 13, wherein said input section of said transconductance amplifier comprises a differential voltage input stage and a level shift and additional gain stage, and said level shift and additional gain stage is configured to output said high side signal and said low side signal.

15. The frequency compensation circuit of claim 13, wherein said output section comprises a plurality of pairs of complementary transistors, each of said pairs of complementary transistors comprising a p-type transistor and a n-type transistor, and said high side signal is directed to control terminals of p-type transistors and said low side signal is directed to control terminals of n-type transistors.

16. The internal frequency compensation circuit of claim 15, wherein each of said plurality of pairs of complementary transistors comprises a NMOS and PMOS transistor.

17. The internal frequency compensation circuit of claim 15, wherein each of said plurality of pairs of complementary transistors comprises a NPN and PNP transistor.

* * * * *